US010389355B2

(12) United States Patent
Stone

(10) Patent No.: US 10,389,355 B2
(45) Date of Patent: Aug. 20, 2019

(54) CAPACITIVE TOUCH DEVICE

(71) Applicant: Novalia Ltd, Cambridge (GB)

(72) Inventor: Kate Stone, Cambridge (GB)

(73) Assignee: Novalia Ltd, Cambridge (GB)

( * ) Notice: Subject to any disclaimer, the term of this patent is extended or adjusted under 35 U.S.C. 154(b) by 0 days.

(21) Appl. No.: 15/519,337

(22) PCT Filed: Oct. 15, 2015

(86) PCT No.: PCT/GB2015/053059
§ 371 (c)(1),
(2) Date: Apr. 14, 2017

(87) PCT Pub. No.: WO2016/059414
PCT Pub. Date: Apr. 21, 2016

(65) Prior Publication Data
US 2017/0237430 A1    Aug. 17, 2017

(30) Foreign Application Priority Data

Oct. 17, 2014    (GB) .................................. 1418443.6

(51) Int. Cl.
*H03K 17/975*    (2006.01)
*H03K 17/96*    (2006.01)
(Continued)

(52) U.S. Cl.
CPC ......... *H03K 17/9622* (2013.01); *B42D 15/00* (2013.01); *G06F 3/0202* (2013.01);
(Continued)

(58) Field of Classification Search
CPC ..... H03K 17/9622; H03K 2217/94094; H03K 2217/96066; H03K 2217/960755;
(Continued)

(56) References Cited

U.S. PATENT DOCUMENTS 4,096,577 A    6/1978    Ferber et al.
6,845,583 B2    1/2005    Lee
(Continued)

FOREIGN PATENT DOCUMENTS

AU    2014202373 A1    5/2014
CN    102402895    4/2012
(Continued)

OTHER PUBLICATIONS

Combined search and examination report issued by United Kingdom Intellectual Property Office for patent application No. GB1418443.6 dated Apr. 10, 2015.
(Continued)

*Primary Examiner* — Anthony R Jimenez
(74) *Attorney, Agent, or Firm* — McCarter & English, LLP; David R. Burns

(57) ABSTRACT

A capacitive touch device is described. The device comprises a substrate and a plurality of co-planar capacitive touch switches and conductive tracks connected to the capacitive touch switches disposed directly on a face of the substrate. The capacitive touch switches include first and second capacitive touch switches which are adjacent, separated by a channel and which are electrically isolated from each other. The capacitive touch switches include third and fourth capacitive touch switches which are electrically isolated from the first and second capacitive touch switches, but which are electrically connected to each other by a conductive track which runs through the channel.

12 Claims, 12 Drawing Sheets

(51) Int. Cl.

| | | |
|---|---|---|
| *H05K 1/16* | (2006.01) | |
| *G06F 3/044* | (2006.01) | |
| *B42D 15/00* | (2006.01) | |
| *G06F 3/02* | (2006.01) | |
| *G06F 3/023* | (2006.01) | |
| *G06F 3/0354* | (2013.01) | |
| *H05K 1/11* | (2006.01) | |
| *H05K 1/14* | (2006.01) | |
| *H05K 3/36* | (2006.01) | |

(52) U.S. Cl.
CPC ........ *G06F 3/0231* (2013.01); *G06F 3/03547* (2013.01); *G06F 3/044* (2013.01); *H05K 1/111* (2013.01); *H05K 1/162* (2013.01); *H03K 2017/9602* (2013.01); *H03K 2217/94094* (2013.01); *H03K 2217/96066* (2013.01); *H03K 2217/960755* (2013.01); *H05K 1/141* (2013.01); *H05K 3/361* (2013.01); *H05K 2201/055* (2013.01); *H05K 2201/10053* (2013.01); *H05K 2201/10151* (2013.01)

(58) Field of Classification Search
CPC ............ H03K 2017/9602; B42D 15/00; G06F 3/0202; G06F 3/0231; G06F 3/03547; G06F 3/044; H05K 1/111; H05K 1/162; H05K 1/141; H01H 13/00; H01H 13/14; H01H 13/70; H01H 13/702; H01H 13/7006; H01H 13/704; H01H 13/72; H01H 13/78; H01H 13/79; H01H 2003/00; H01H 2203/02; H01H 2239/074; H01H 1/00; H01H 1/16; H01H 1/36; H01H 3/12
USPC ........................................................ 200/600
See application file for complete search history.

(56) References Cited

U.S. PATENT DOCUMENTS

| | | | |
|---|---|---|---|
| 7,477,242 B2 * | 1/2009 | Cross ...................... | G06F 3/044 178/18.06 |
| 7,630,203 B1 | 12/2009 | Chen et al. | |
| 7,967,214 B2 | 6/2011 | Landau et al. | |
| 8,558,561 B2 | 10/2013 | Sage | |
| 8,719,033 B2 | 5/2014 | Lien et al. | |
| 9,354,703 B2 | 5/2016 | Maggiali et al. | |
| 9,507,450 B2 | 11/2016 | Nakamura | |
| 9,599,451 B2 | 3/2017 | Ullmann et al. | |
| 2002/0089856 A1 | 7/2002 | Vogel et al. | |
| 2003/0192209 A1 | 10/2003 | Yeh | |
| 2004/0237359 A1 | 12/2004 | Lee | |
| 2009/0068760 A1 | 3/2009 | Nelson et al. | |
| 2009/0273570 A1 | 11/2009 | Degner et al. | |
| 2009/0314550 A1 | 12/2009 | Layton | |
| 2010/0245246 A1 | 9/2010 | Rosenfeld et al. | |
| 2010/0307036 A1 | 12/2010 | Lien et al. | |
| 2011/0140888 A1 | 6/2011 | Stone et al. | |
| 2011/0272260 A1 | 11/2011 | Wallace et al. | |
| 2012/0247938 A1 * | 10/2012 | Saito ....................... | G06F 3/044 200/600 |
| 2013/0135548 A1 | 5/2013 | Burberry et al. | |
| 2013/0277197 A1 | 10/2013 | Mi | |
| 2013/0300707 A1 | 11/2013 | Hershman | |
| 2013/0314374 A1 | 11/2013 | Kim et al. | |
| 2013/0329347 A1 | 12/2013 | Kuo et al. | |
| 2014/0021027 A1 * | 1/2014 | Stone ................... | H03K 17/955 200/600 |
| 2014/0183073 A1 | 7/2014 | Pernu et al. | |
| 2014/0266247 A1 | 9/2014 | Wallace et al. | |
| 2015/0185889 A1 | 7/2015 | Nakamura | |
| 2015/0286185 A1 | 10/2015 | Kim et al. | |
| 2016/0209441 A1 * | 7/2016 | Mazzeo ................ | G01P 15/125 |
| 2017/0246898 A1 | 8/2017 | Stone | |
| 2017/0250687 A1 | 8/2017 | Stone | |
| 2017/0315636 A1 | 11/2017 | Stone | |

FOREIGN PATENT DOCUMENTS

| | | |
|---|---|---|
| DE | 202008012847 U1 | 12/2008 |
| EP | 1293928 A2 | 3/2003 |
| EP | 2416338 A1 | 2/2012 |
| EP | 2568364 A2 | 3/2013 |
| GB | 2475253 A | 5/2011 |
| GB | 2487579 A | 8/2012 |
| GB | 2487580 A | 8/2012 |
| KR | 1014523020000 | 10/2014 |
| WO | 2013/128209 A1 | 9/2013 |
| WO | WO 2016/059413 | 10/2015 |
| WO | WO 2016/059415 | 10/2015 |

OTHER PUBLICATIONS

U.S. Appl. No. 15/521,449, filed Apr. 24, 2014, Pending.
International Preliminary Report on Patentability for International Application No. PCT/GB2015/053059 dated Apr. 27, 2017.
U.S. Appl. No. 15/521,449, filed Apr. 24, 2017, 2017-0315636, Published.
U.S. Appl. No. 15/519,361, filed Apr. 14, 2017, 2017-0250687, Abandoned.
U.S. Appl. No. 15/519,358, filed Apr. 14, 2017, 2017-0246898, Published.
Google, circuit board. define: circuit board—Google Search. 2 pages. Search Requested Jun. 9, 2018.
Google, Toy. definition of toy—Google Search. 2 pages. Search Requested Jun. 9, 2018.
Google, Track. define:tracks—Google Search. 3 pages. Search Requested Jun. 9, 2018.
Madehow.com, Computer Mouse. Retrieved online at: https://web.archive.org/web/20180402192822/http://www.madehow.com/Volume-5/Computer-Mouse_html. 5 pages, (2018).
International Preliminary Report on Patentability for Application No. PCT/GB2015/053060, dated Apr. 27, 2017.
International Preliminary Report on Patentability for Application No. PCT/GB2015/053158, dated May 4, 2017. 7 pages.
International Preliminary Report on Patentability for International Application No. PCT/GB2015/053057 dated Apr. 27, 2017.
International Search Report for Application No. PCT/GB2015/053158, dated Jan. 21, 2016.
United Kingdom Search Report for Application No. GB1418441.0, dated Dec. 15, 2014.
United Kingdom Search Report for Application No. GB1418444.4, dated Nov. 28, 2014.
United Kingdom Search Report for Application No. GB1418996.3, dated Sep. 22, 2015.
Written Opinion for Application No. PCT/GB2015/053158, dated Jan. 21, 2016.

* cited by examiner

CAPACITIVE TOUCH DEVICE

RELATED APPLICATIONS

This application is a 35 U.S.C. § 371 national stage filing of International Application No. PCT/GB2015/053059, filed on Oct. 15, 2015, which claims priority to United Kingdom Patent Application No. 1418443.6, filed on Oct. 17, 2014. The entire contents of each of the foregoing applications are incorporated herein by reference.

FIELD OF THE INVENTION

The present invention relates to a capacitive touch device, in particular, a capacitive touch device in the form of a printed article.

Electronic components are increasingly being incorporated into printed items, such as books, posters and greeting cards, to allow these items to become interactive. In particular, capacitive touch sensors are being incorporated into items to allow a user to provide input and the item to respond. Examples of such items are described in GB 2 464 537 A and WO 2004 077286 A.

SUMMARY

The present invention seeks to provide an arrangement which allows complex patterns of conductive touch switches and tracks to be formed in a single-pass process (such as printing).

According to a first aspect of the present invention there is provided a capacitive touch device comprising a substrate (such as a flexible sheet) and a plurality of co-planar capacitive touch switches and conductive tracks connected to the capacitive touch switches disposed directly on a face of the substrate. The capacitive touch switches comprise first and second capacitive touch switches which are adjacent, separated by a channel, and which are electrically isolated from each other and third and fourth capacitive touch switches which are electrically isolated from the first and second capacitive touch switches, but which are electrically connected to each other by a conductive track which runs through the channel.

Thus, a capacitive touch device can be fabricated more easily and/or cheaply, for example, without the need to apply conductive ink or foil to opposite faces of a substrate and/or make electrical contacts to opposite faces of a substrate.

The conductive track may be a first conductive track and the capacitive touch switches may further comprise fifth and sixth capacitive touch switches which are electrically isolated from the first, second, third and fourth capacitive touch switches, but which are electrically connected to each other by a second conductive track which runs through the channel.

The channel may have a channel width between the first and second capacitive touch switches and the first capacitive touch switches may have a switch width which is at least three times the channel width.

The sides of the channel may be parallel.

The capacitive touch switches may each have an area of at least 0.2 cm$^2$, at least 0.5 cm$^2$ at least 1 cm$^2$, at least 2 cm$^2$ or at least 5 cm$^2$. The conductive tracks may each have a width, in the channel, of at least 0.05 mm, at least 0.1 mm or at least 0.2 mm. The conductive tracks may each have a width, in the channel, of no more than 2 mm mm, no more than 1 mm or no more than 0.5 mm.

The capacitive touch switches and conductive tracks may comprise conductive ink, such as carbon-based conductive ink. The device may further comprise contact lands and the conductive tracks may connect the touch switches and the contact lands.

The capacitive touch switches and conductive tracks may comprise metallic foil.

The flexible sheet may comprise a fibre-based material, such as paper, card or cardboard. The flexible sheet may comprise a plastic material. The flexible sheet may comprise a laminate of one or more layers. The material, e.g. the fibre-based material, may comprise recycled material. This can be environmentally friendly.

The capacitive touch switches may be arranged to provide capacitive touch button(s), capacitive touch slider(s) and/or capacitive touch wheel(s).

The capacitive touch switches may be rectangular or polygonal. The capacitive touch switches may be circular or elliptical. Thus, the capacitive touch switches may be arranged in an array.

The capacitive touch switches may be sector-shaped, truncated sector-shaped and/or annular sector-shaped. Thus, the capacitive touch pads may be arranged in a circular array angularly and/or radially.

The device may further comprise a capacitive touch controller coupled to the capacitive touch switches configured to have a sensing threshold selected such that, in response to a user's digit passing over the first and second capacitive touch switches but not the third or fourth capacitive touch switches, the controller generates respective triggers for the first and second touch switches, but not triggers for the third or fourth capacitive touch switches.

The device may comprise one or more controllers, e.g. microcontrollers. The device may comprise one or more output devices. The device may comprise two or more different types of output device. An output device may comprise a light-emitting device, such as a light-emitting diode. An output device may comprise a display. An output device may comprise sound-emitting device, such as a piezoelectric sounder. The device may comprise a wireless interface device, such as a Bluetooth transceiver.

The capacitive touch device may be a printed article.

The printed article may be a pamphlet, flyer leaflet or other single sheet article. The printed article may be a promotional item. The printed article may be a map or a cover for a map. The printed article may be postcard or greetings card. The printed article may be an insert for another item, such as a magazine, book or other product. The printed article may be an insert in or part of product packaging. The product may be media (such as a vinyl record or a CD). The product may be an article of clothing, food stuff (such as box of cereal) or game. The insert may be free or bound into another item.

The device may have an areal size of at least 100 cm$^2$, at least 200 cm$^2$ or at least 500 cm$^2$ or more.

The present invention seeks to provide an improved method of assembling a capacitive touch device, particularly a low-cost capacitive touch device made from a flexible sheet material, such as paper or card.

According to a second aspect of the present invention there is provided a method of assembling a capacitive touch device. The method comprises providing a flexible sheet having first and second faces and first and second wings divided by a fold line. The flexible sheet supports capacitive touch switches, contact lands and conductive tracks interconnecting the capacitive touch switches and the contact lands on the first face of the flexible sheet. The method comprises providing adhesive on the first face of the flexible sheet so as to bond the first and second wings and to bond a circuit board to the flexible sheet. The method comprises placing a circuit board on the flexible sheet, the circuit board having contact pads which are aligned with the contact lands. The method comprises folding the flexible sheet along the fold line so as to bond the first and second wings with the circuit board interposed between the first and second wings.

Thus, the device can be assembled in just a few steps quickly and/or cheaply. Furthermore, the device can be assembled without the need for specialist equipment (such as a converter) and so allows the device to be sold in kit form to a re-seller or hobbyist. The device can be customised prior to assembly, for example, by printing on the second face of the sheet.

The flexible sheet may support capacitive touch switches, contact lands and/or conductive tracks on the first wing and/or second wing.

The capacitive touch switches, contact lands and/or conductive tracks may comprise conductive ink. The conductive ink may be carbon-based conductive ink.

The capacitive touch switches, contact lands and/or conductive tracks may comprise metallic foil.

The flexible sheet may comprise indicia printed on the second face of the flexible sheet. The indicia may include images and/or text. The indicia may comprise one colour of ink. The indicia may comprise more than one colour of ink.

Providing the adhesive on the first face of the flexible sheet may comprise providing the adhesive on the first wing and/or the second wing.

Placing the circuit board on the flexible sheet may comprise placing the circuit board on the first wing.

The flexible sheet may comprise a fibre-based material, such as paper, card or cardboard. The flexible sheet may comprise a plastic material. The flexible sheet may comprise a laminate of one or more layers. The material, e.g. the fibre-based material, may comprise recycled material. This can be environmentally friendly.

Providing the flexible sheet and providing adhesive comprises providing a flexible sheet having an adhesive layer and a peelable backing layer and the method may further comprise removing at least part of backing layer before folding the flexible sheet.

The method may comprise passing the flexible sheet folded along the fold line through a press, such as a roller press.

The flexible sheet may further comprise a wing extension extending from the first wing along another fold line and the method may further comprise folding the wing extension onto first wing before completing folding the second wing onto the first wing.

The wing extension may include an aperture configured to accommodate the circuit board. Thus, the wing extension may be used for form a cavity for the circuit board.

The method may comprise trimming one or more edges of the device. This may include trimming (and thus removing) the folded edge and so the first and second sheets may not longer be a unitary piece.

The device may include three, four, five or more wings. The wings need not be all the same size.

The fold lines need not all be parallel. For example, one or more fold lines may be perpendicular to another fold line. Thus, a device may be assembled from an 'L'-shaped, a 'T'-shaped, a '+'-shaped or other, more complex layouts. A fold line need not be continuous. For example, a fold line may be split into more than sections by slits or apertures.

According to a third aspect of the present invention there is provided a capacitive touch device fabricated using the method.

According to a fourth aspect of the present invention there is provided a capacitive touch device. The capacitive touch device comprises a flexible sheet laminate comprising a first flexible sheet and a second flexible sheet. The capacitive touch device comprises capacitive touch switches, contact lands and conductive tracks interconnecting the capacitive touch switches and the contact lands supported on inward faces of the flexible sheet(s). The capacitive touch device comprises adhesive on the inward faces of the flexible sheet(s) so as to bond the first and second sheets and to bond a circuit board to flexible sheet(s). The capacitive touch device comprises a circuit board interposed between the flexible sheets, the circuit board having contact pads which are aligned with the contact lands.

The first and second sheets may comprise first and second wings of a single sheet divided by a fold line.

The device may further comprise a strip of flexible sheet interposed between the flexible sheets, the flexible strip having an aperture and the circuit board may be disposed in the aperture.

The circuit board may support a coin cell holder adjacent to the second sheet and wherein the second sheet has a slit arranged to form a flap over the coin cell holder which is configured to allow a coin cell to be re-insertably removed from the coin cell holder.

The fold line need not be a single straight line. Slits may be used to provide more complex folding patterns.

The circuit board may have contact pads and adhesive may provide an interconnect layer which has a sheet resistance, $R_S$, of at least 0.5 M$\Omega$/sq and which is disposed between the sheet and the circuit board, and which is arranged to provide electrical connections between the contact lands and corresponding contact pads.

The device may comprise one or more controllers, e.g. microcontrollers. The device may comprise one or more output devices. The device may comprise two or more different types of output device. An output device may comprise a light-emitting device, such as a light-emitting diode. An output device may comprise a display. An output device may comprise sound-emitting device, such as a piezoelectric sounder. The device may comprise a wireless interface device, such as a Bluetooth transceiver.

The capacitive touch device may be a printed article.

The printed article may be a pamphlet, flyer leaflet or other single sheet article. The printed article may be a promotional item. The printed article may be a map or a cover for a map. The printed article may be postcard or greetings card. The printed article may be a map or a cover for a map. The printed article may be an insert for another item, such as a magazine, book or other product. The printed article may be an insert in or part of product packaging. The product may be media (such as a vinyl record or a CD). The product may be an article of clothing, game or food stuff (such as box of cereal). The insert may be free or bound into another item. The printed article may be a game or playing card.

The device may have an areal size (in plan view) of at least 100 cm$^2$, at least 200 cm$^2$ or at least 500 cm$^2$ or more.

The present invention seeks to provide a simple arrangement for accessing and replacing a coin cell.

According to a fifth aspect of the present invention there is provided a printed article. The printed article comprises first and second sheets and a circuit board interposed between the first and second sheets, the circuit board supporting a coin cell holder adjacent to the second sheet. The second sheet has a slit arranged to form a flap over the coin cell holder which is configured to allow a coin cell to be re-insertably removed from the coin cell holder.

Thus, the lifetime of even a low-cost printed article can be extended by allowing a user to replace a spent cell with a fresh one without the need to cut or open up the printed article in a way which is likely to damage the article or spoil its appearance.

The flexible sheet may comprise a fibre-based material, such as paper, card or cardboard. The flexible sheet may comprise a plastic material. The flexible sheet may comprise a laminate of one or more layers. The material, e.g. the fibre-based material, may comprise recycled material. This can be environmentally friendly.

The printed article further may further comprise a re-appliable removable sticker.

The sticker may be transparent. Thus, even if the flap is located in an area where there are printed indicia, the appearance of the device may still be maintained.

The sticker may be opaque. The sticker may support printed indicia. Thus, even if the flap is located in an area where there are printed indicia, the appearance of the device may still be maintained.

The sticker may have the same finish (e.g. matt or glossy) as the underlying sheet.

The coin cell holder may be a surface mount type. The coin cell holder may comprise a plate and the coin cell is slidable under the plate.

The second sheet may support printed indicia, such as images and/or text, on an outside face. The indicia may comprise one colour of ink. The indicia may comprise more than one colour of ink.

The first sheet may support conductive tracks on an inside face.

The first and second sheets may comprise first and wings of a single sheet which is folded along a fold line.

The circuit board may have contact pads and adhesive may provide an interconnect layer which has a sheet resistance, $R_S$, of at least 0.5 M$\Omega$/sq and which is disposed between the sheet and the circuit board, and which is arranged to provide electrical connections between the contact lands and corresponding contact pads.

The device may comprise one or more controllers, e.g. microcontrollers. The device may comprise one or more output devices. The device may comprise two or more different types of output device. An output device may comprise a light-emitting device, such as a light emitting diode. An output device may comprise a display. An output device may comprise sound emitting device, such as a piezoelectric sounder. The device may comprise a wireless interface device, such as a Bluetooth transceiver.

The printed article may be a pamphlet, flyer leaflet or other single sheet article. The printed article may be a promotional item. The printed article may be a map or a cover for a map. The printed article may be postcard or greetings card. The printed article may be an insert for another item, such as a magazine, book or other product. The printed article may be an insert in or part of product packaging. The product may be media (such as a vinyl record or a CD). The product may be an article of clothing, game or food stuff (such as box of cereal). The insert may be free or bound into another item. The printed article may be a game or playing card.

The device may have an areal size of at least 100 cm$^2$, at least 200 cm$^2$ or at least 500 cm$^2$ or more.

BRIEF DESCRIPTION OF THE DRAWINGS

Certain embodiments of the present invention will now be described by way of example, with reference to the accompanying drawings, in which.

DETAILED DESCRIPTION OF CERTAIN EMBODIMENTS

Figure 1:
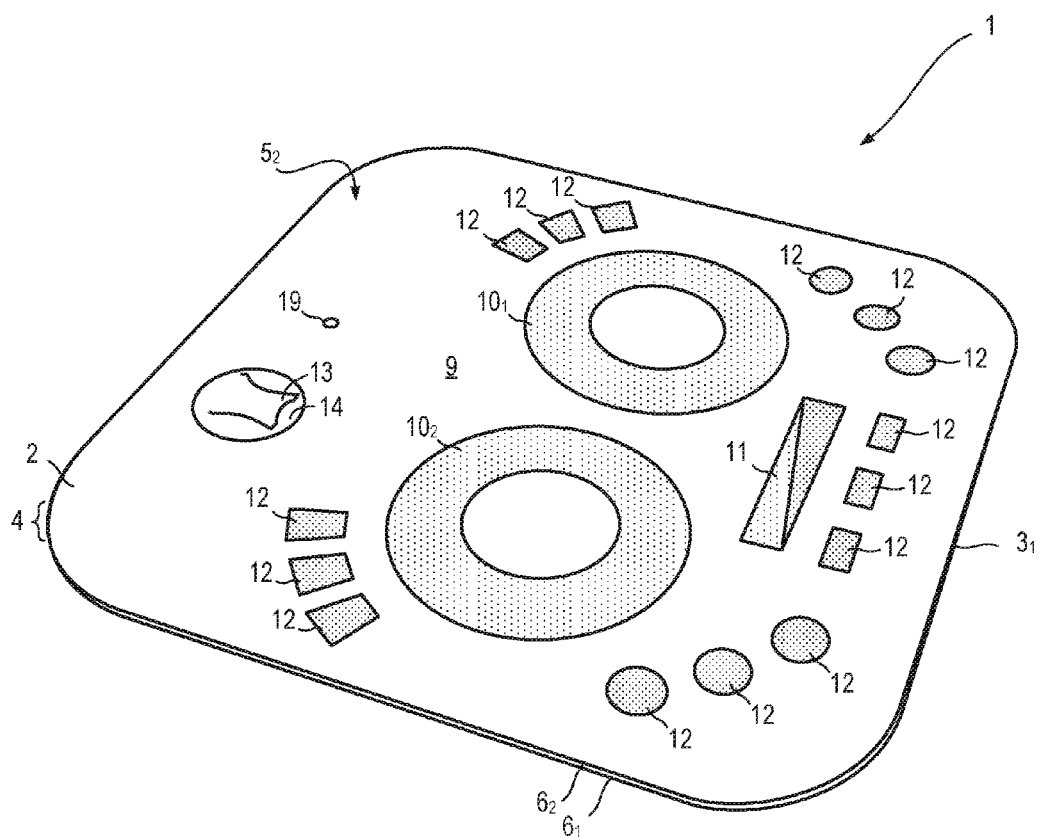
FIG. 1 is a perspective view of an assembled printed article.

FIG. 1 shows a capacitive touch device 1 in the form of a vinyl record sleeve insert.

The capacitive touch device 1 is pairable with a Bluetooth (®) enabled mobile device, such as a smart phone, and can be used to provide input signals for controlling the mobile device as described, for example, in WO 2013 117917 A2.

Referring to FIGS. 1 to 5, the insert 1 comprises a single sheet 2 (best seen in FIG. 5) of card which is folded in on itself along first and second fold lines $3_1$, $3_2$ (best seen in FIG. 5) to form a laminate structure 4 (best shown in FIG. 1). Paper or card can be used having a weight of, for example, about 100 to about 200 g/m$^2$. Heavier paper or card or even cardboard can be used, for example, having a weight of up to 350 g/m$^2$ or more.

Figure 5:
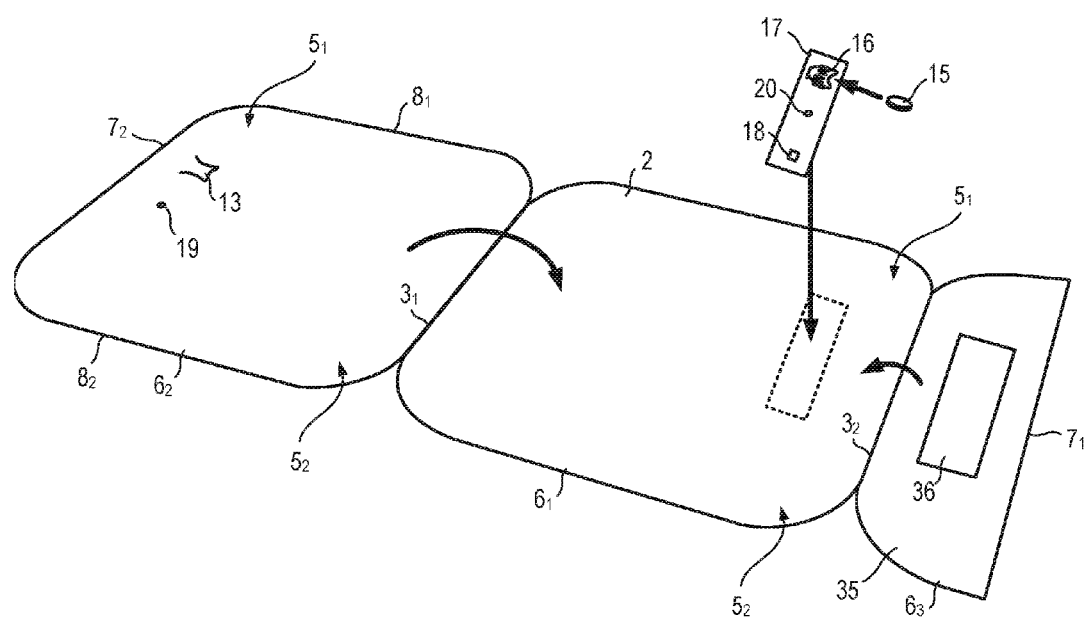
FIG. 5 shows steps during assembly of the printed article shown in FIG. 1.

Referring in particular to FIG. 5, the sheet 1 has first and second faces $5_1$, $5_2$ and the first fold line $3_1$ separates first and second wings $6_1$, $6_2$. The second fold line $3_2$ separates the first wing $6_1$ and a wing extension $6_3$ (herein also referred to as a "flap"). The sheet 2 has first and second ends $7_1$, $7_2$ and first and second edges $8_1$, $8_2$.

Referring in particular to FIG. 1, the second (outward) face $5_2$ of the second wing $6_2$ supports printed indicia 9. In this case, the printed indicia 9 include an image of a DJ mixing desk including images of first and second turntables $10_1$, $10_2$, a crossover slider 11 and other buttons 12.

The second wing $6_2$ includes a tongue-shaped flap 13 held down by a transparent sticker 14. The sticker 14 can be peeled off the area surrounding the flap 13 or entirely removed to allow the flap 13 to be lifted and access a coin cell 15 held in a holder 16 mounted on a circuit board 17 which also supports a microcontroller 18 providing Bluetooth (®) wireless connectivity. After the cell 15 has been replaced, the user can reapply or re-stick the sticker 14 or a new sticker (not shown).

The second wing $6_2$ also includes a through-hole 19 which allows ambient light to pass to a photodiode 20 on the circuit board 17. This can be used to pass a signal (not shown) to the microcontroller 18 to switch the microcontroller 18 into a power-saving mode.

Figure 4:
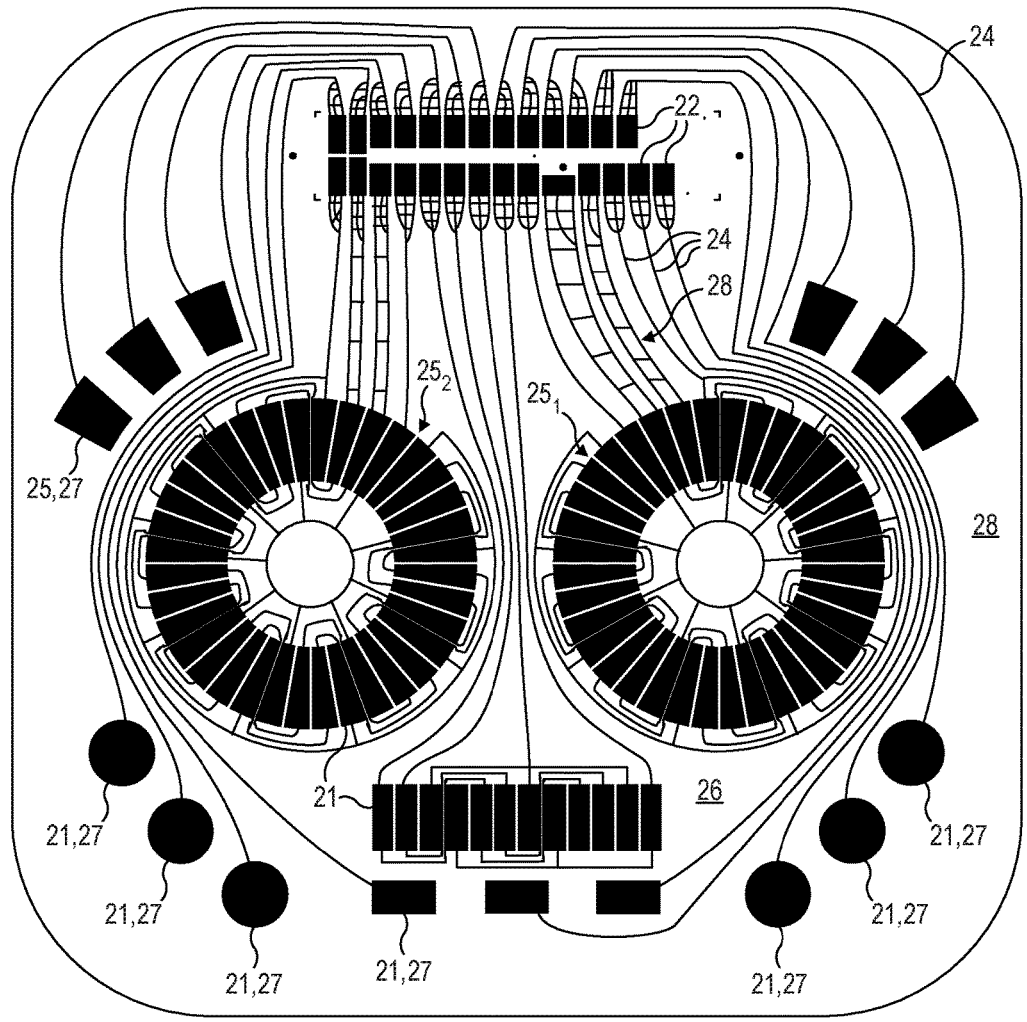
FIG. 4 is a plan view of capacitive touch elements, contact lands and interconnecting tracks on a printed sheet.

Referring in particular to FIG. 4, the first face $5_1$ of the first wing $6_1$ supports a plurality of electrically-conductive pads 21 for providing capacitive touch switches, an array of electrically-conductive pads 22 for providing contact lands for contact pads 23 (FIG. 6) on the circuit board 17 and electrically-conductive tracks 24 interconnecting conductive pads 21, 22. The conductive pads 21, 22 and tracks 24 comprise carbon-based conductive ink formed by printing, for example, by lithographic or ink-jet printing process.

Figure 6:
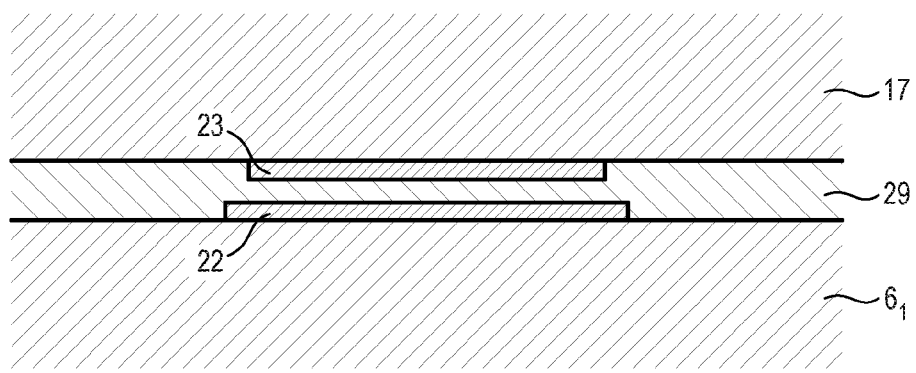
FIG. 6 is a side view illustrating coupling of a contact lands and contact pads through an adhesive layer.

Each conductive switch 21 has a surface area which is sufficiently large (e.g. >0.2 cm$^2$) to provide a capacitive touch pad. Each conductive pad 22 has an area which is sufficiently large to provide electrical capacitive or resistive contact to a contact pad 23 (FIG. 6) on the circuit board 17 (FIG. 6).

Some of the conductive switches 21 are arranged in an annular array to provide first and second capacitive touch wheels $25_1$, $25_2$. Other conductive switches 21 are arranged in a linear array to provide a capacitive touch slider 26. Other conductive switches 21 provide simple capacitive touch buttons 27.

The printed indicia 9 and the conductive switches 21 are positioned so that, when the second wing $6_2$ is folded over onto the first wing $6_1$, the images of first and second turntables $10_1$, $10_2$, crossover slider 11 and other buttons 12 are aligned with corresponding capacitive touch wheels $25_1$, $25_2$, capacitive touch slider 26 and capacitive touch buttons 27.

The conductive tracks 24 have a width, w, which is sufficiently small (e.g. <1 mm) so as to reduce capacitive coupling with a finger. As shown in FIG. 4, a conductive track 24 may include a section 28 having a ladder-shaped arrangement as described, for example, in WO 2012 101448 A2 which can be used to help to reduce capacitance per unit length of a track 24 without significantly reducing its conductivity.

Figure 2:
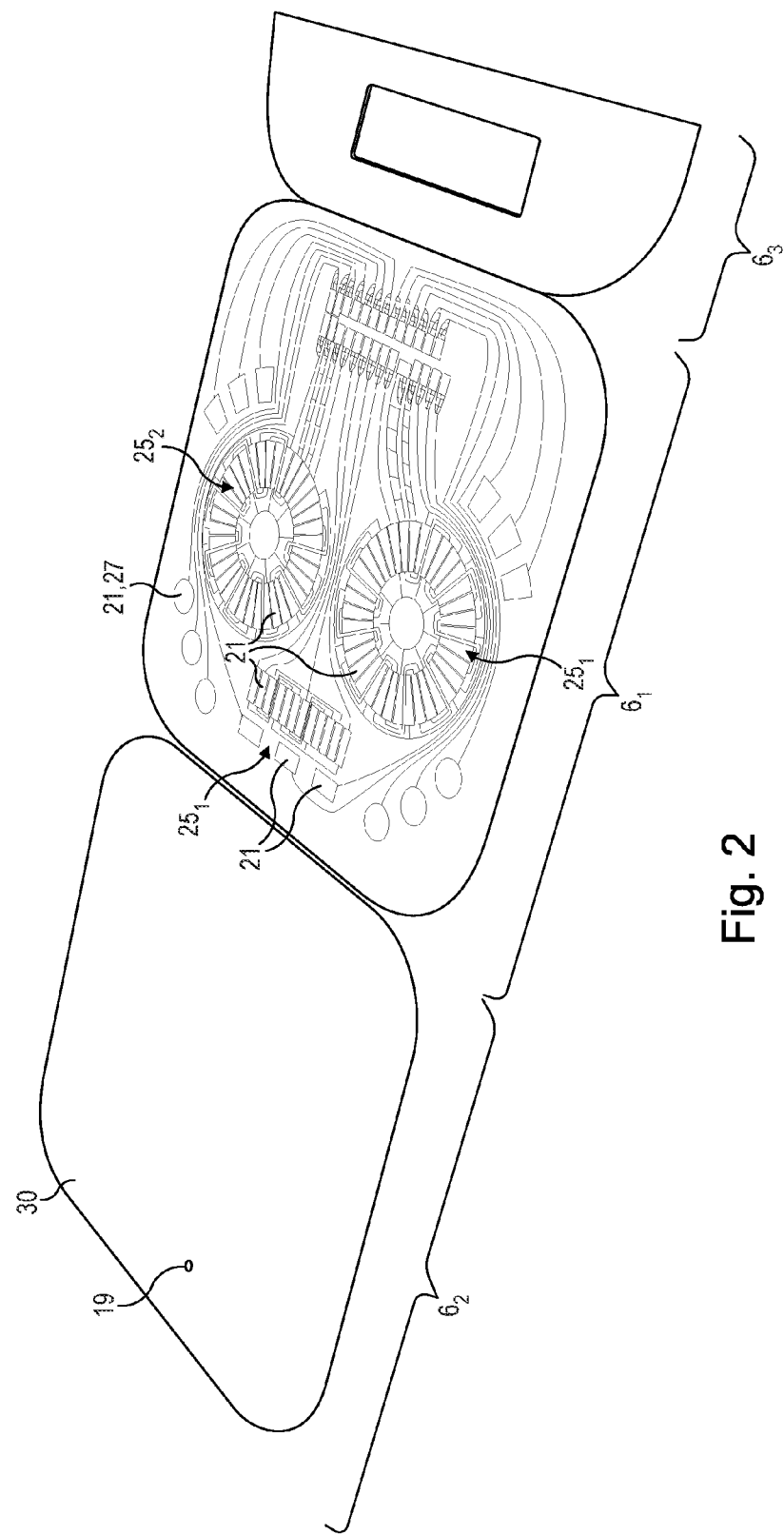
FIG. 2 is a perspective view of an unfolded printed sheet before assembly.
Figure 3:
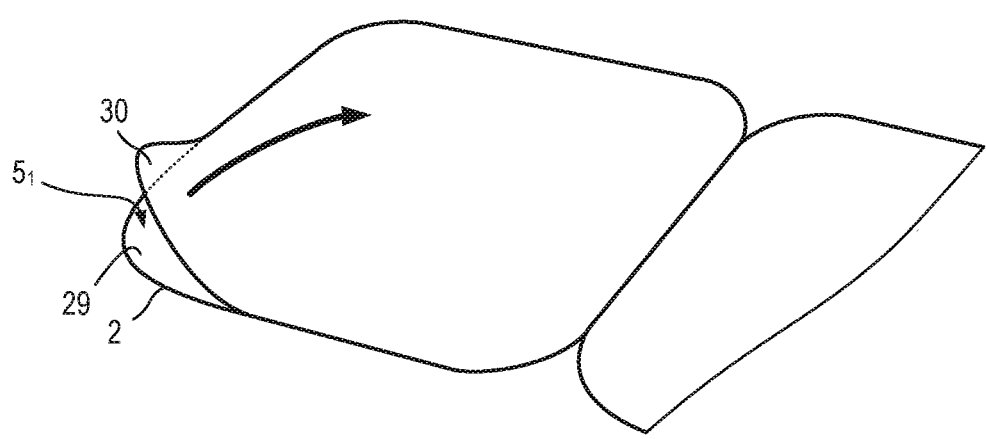
FIG. 3 shows a backing film being peeled off a printed sheet to reveal an adhesive-covered surface.

Referring in particular to FIGS. 2, 3 and 4, the first face $5_1$ of the sheet 2, which includes the conductive pads 21, 22, the conductive tracks 24 and unprinted areas 28, is coated with adhesive 29. In this case, the adhesive 29 is covered by a backing layer 30 which can be peeled away to reveal the adhesive 29.

The adhesive 29 need not applied across all of the first face $5_1$ of the sheet 2. For example, adhesive 29 may be applied in selected areas including, for example, on just the first or second wing $6_1$, $6_2$ and/or around the edges of the wing(s) $6_1$, $6_2$.

An adhesive 29 need not be applied prior to assembly. The adhesive 29 can be applied during assembly. The adhesive 29 can be applied to the required areas by spraying an aerosol-based adhesive, using an adhesive stick, painting or printing liquid-based adhesive or by applying adhesive tape. The adhesive 29 may be one which is curable, for example, using heat or UV light.

Figure 4A:
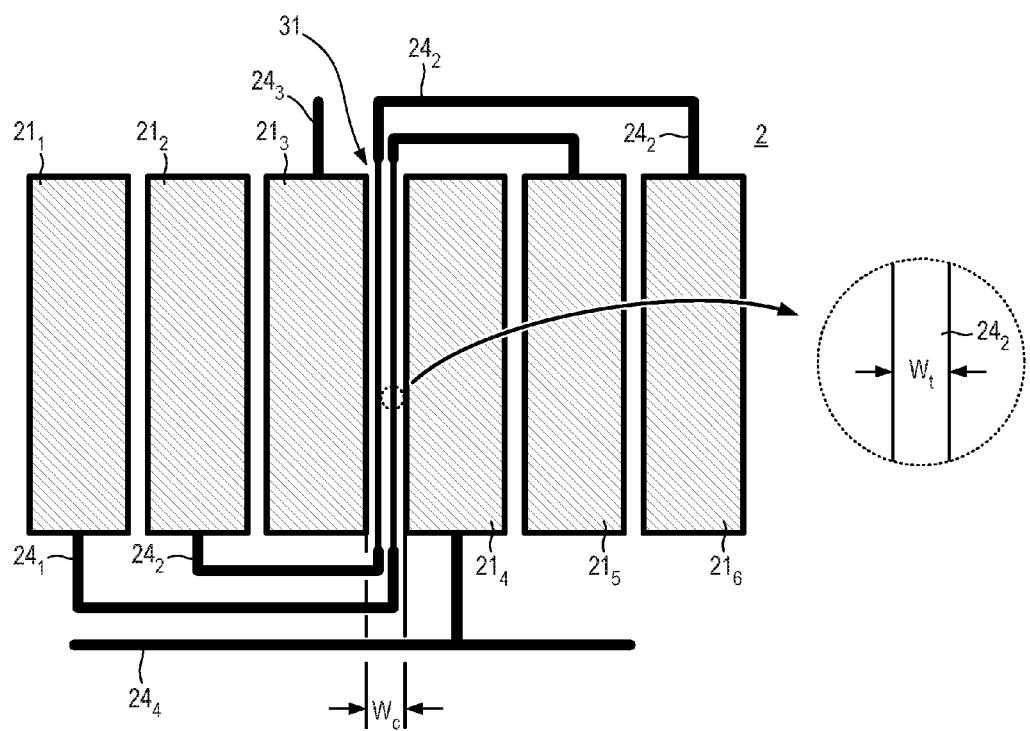
FIG. 4a is a more detailed view of capacitive touch elements and conductive tracks shown in FIG. 4.

Referring to FIG. 4a, a portion of the capacitive touch slider 26 is shown in more detail.

The touch slider 26 is supported directly on the first face $5_1$ of sheet 2 and includes, among others, first, second, third, fourth, fifth and sixth co-planar capacitive touch switches $21_1$, $21_2$, $21_3$, $21_4$, $21_5$, $21_6$ in a row. Conductive tracks $24_1$, $24_2$, $24_3$, $24_4$ are also supported directly on the first face $5_1$ of the sheet 2, i.e. on the same face as the capacitive touch switches $21_1$, $21_2$, $21_3$, $21_4$, $21_5$, $21_6$.

A first conductive track $24_1$ interconnects first and fifth capacitive touch switches $21_1$, $21_5$. A second conductive track $24_2$ interconnects second and sixth capacitive touch switches $21_2$, $21_6$. Third and fourth conductive tracks $24_3$, $24_4$ are connected to the third and fourth capacitive touch switches $21_3$, $21_4$ respectively.

The third and fourth capacitive touch switches $21_3$, $21_4$ are adjacent and are electrically isolated from each other. The third and fourth capacitive touch switches $21_3$, $21_4$ are separated by a channel 31 having a width $w_c$.

The first and fifth capacitive touch switches $21_1$, $21_5$ are electrically isolated from the third and fourth capacitive touch switches $21_3$, $21_4$. However, the first conductive track $24_1$, which interconnects the two switches $21_1$, $21_5$, runs through the channel 31.

Likewise, second and sixth capacitive touch switches $21_2$, $21_6$ are electrically isolated from the third and fourth capacitive touch switches $21_3$, $21_4$ and the second conductive track $24_2$, which interconnects the two switches $21_2$, $21_6$, runs through the channel 31.

In the channel 31, the first and second conductive tracks $24_1$, $24_2$ have a width $w_t$. The channel width $w_c$ is at least three times, preferably at least five times, the track width $w_t$. The tracks $24_1$, $24_2$ are about 0.1 mm to 0.5 mm thick in the channel 31.

Thus, as the user passes their finger over the slider 26 over the third and fourth capacitive touch pads $21_3$, $21_4$, it can activate the third and fourth capacitive touch pad $21_3$, $21_4$, but not the other pads $21_1$, $21_2$, $21_5$, $21_6$ while the finger is over the channel 31.

Figure 4B:
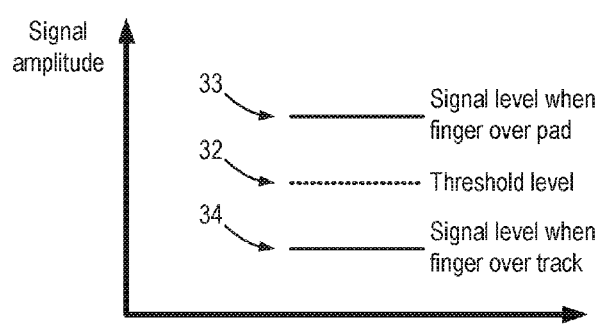
FIG. 4b illustrates a threshold level for triggering a response.

Referring also to FIG. 4b, the microcontroller 18 (FIG. 5) provides, among other functions, a capacitive touch controller. The microcontroller 18 is programmed to have a sensing threshold 32 selected such that, in response to a user's finger being directly over a capacitive touch pad 21 it has a signal level 33 which exceeds the threshold level 32 and generates a trigger signal (not shown) indicating that the capacitive touch switch 21 has been "pressed" (i.e. activated), but when a user's finger is over a conductive track 24, the measured signal level 34 falls below the threshold level 32 and so no trigger signal is generated.

A similar arrangement is used for the conductive touch wheels $25_1$, $25_2$.

Referring to FIG. 5, as mentioned earlier, a second fold line $3_2$ separates the first wing $6_1$ and a wing extension $6_3$.

The wing extension $6_3$ has a frame portion 35 which defines an aperture 36. The aperture 36 is dimensioned to accommodate the circuit board 17 and is positioned so that when the wing extension $6_3$ is folded over onto the first wing $6_1$ is creates a shallow cavity over the contact lands 22.

The wing extension $6_3$ can be replaced by or augmented by a separate sheet having an aperture. In some cases, the wing extension $6_3$ can be omitted.

Referring also to FIG. 6, even if a low-conductivity adhesive 29 covers contact lands 22, a contact land 22 and a corresponding contact pad 23 on the circuit board 17 can still be electrically coupled.

First, the contact land 22 and corresponding contact pad 23 can be coupled capacitively as described, for example, in WO 2014 096772 A1.

Secondly, the contact land 22 and corresponding contact pad 23 can be coupled resistively as described, for example, in PCT/GB2014/052832. The adhesive 29 preferably should have a sheet resistance $R_S$ of at least 0.5 MΩ/sq.

However, as mentioned earlier, adhesive 29 may be applied to selective areas of the sheet. If the adhesive 29 is non conductive, then it can be omitted in the region over the contact lands 22. Alternatively, an adhesive 29 which is conductive may be used in which case it may be applied in a dot pattern as described in WO 2013 128198 A2.

Figure 7:
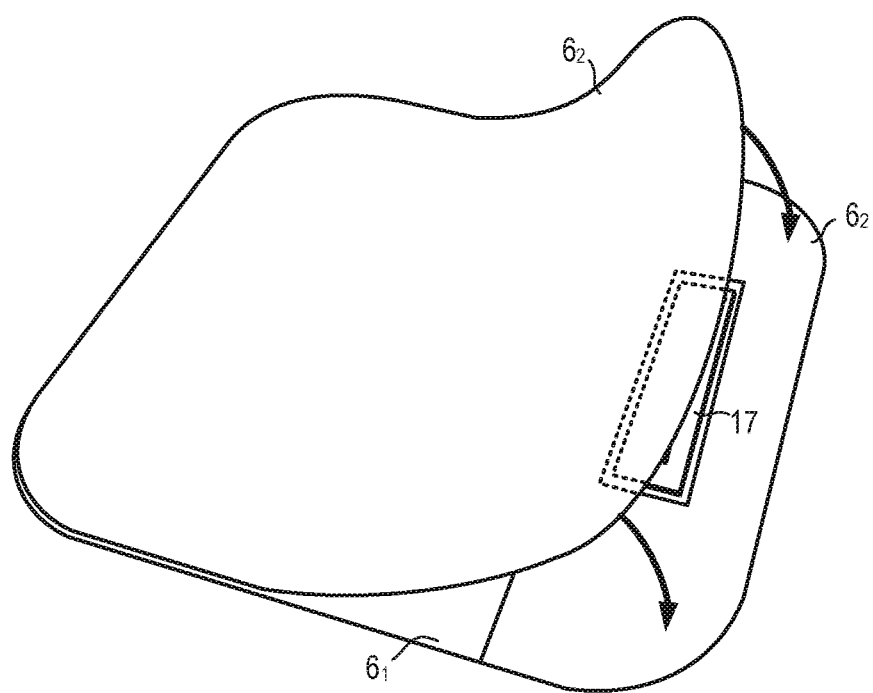
FIG. 7 illustrates a step during assembly of the printed article shown in FIG. 1.
Figure 8:
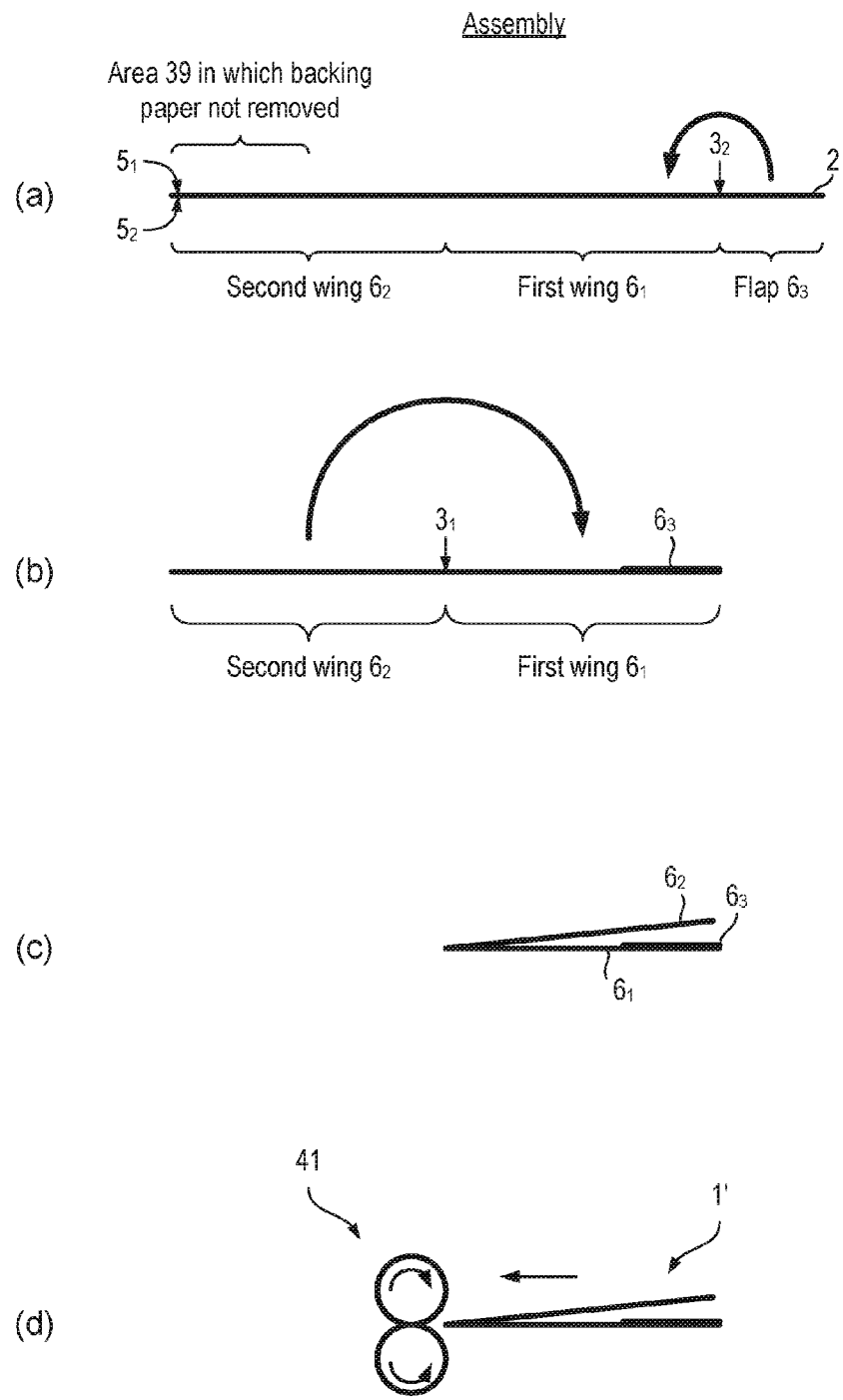
FIGS. 8a to 8g illustrate steps during a first process of assembly.
Figure 8:
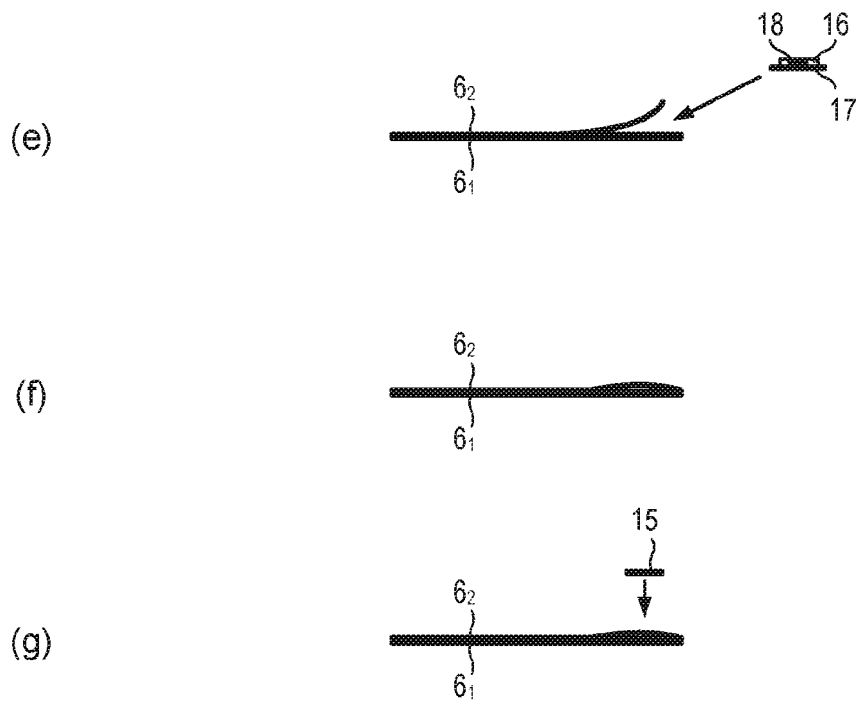

Referring in particular to FIGS. 2, 5 and 7, the device 1 can be assembling by removing the backing paper 30 (or applying an adhesive 29 on the first face $5_1$ of the sheet 2), folding over the wing extension $6_3$ onto the first wing $6_2$, placing the circuit board 17 onto the contact lands 22 on the sheet 2 and then folding the second wing $6_2$ onto the first wing $6_1$.

Referring also to FIGS. 8a to 8g and 9, a specific way of assembling the device 1 is shown.

The backing paper 30 is removed except in area 39 on the second wing $6_2$ (step S1-1). The flap $6_3$ is folded and stuck onto the first wing $6_1$ (step S1-2). The second wing $6_2$ is then folded over (step S1-3). The partially assembled device 1' can be run through a press 41 (step S1-4). The remaining backing paper 30 can be removed (step S1-5) and the circuit board 17 can be placed onto the first wing (step S1-6). The circuit board 17 can be placed with or without the battery 18 in place. The rest of the second wing $6_2$ is folded over (step S1-7). If not already in place, the battery 18 is inserted (step S1-8). The sticker 14 is applied to the flap 13 (step S1-9).

Figure 10:
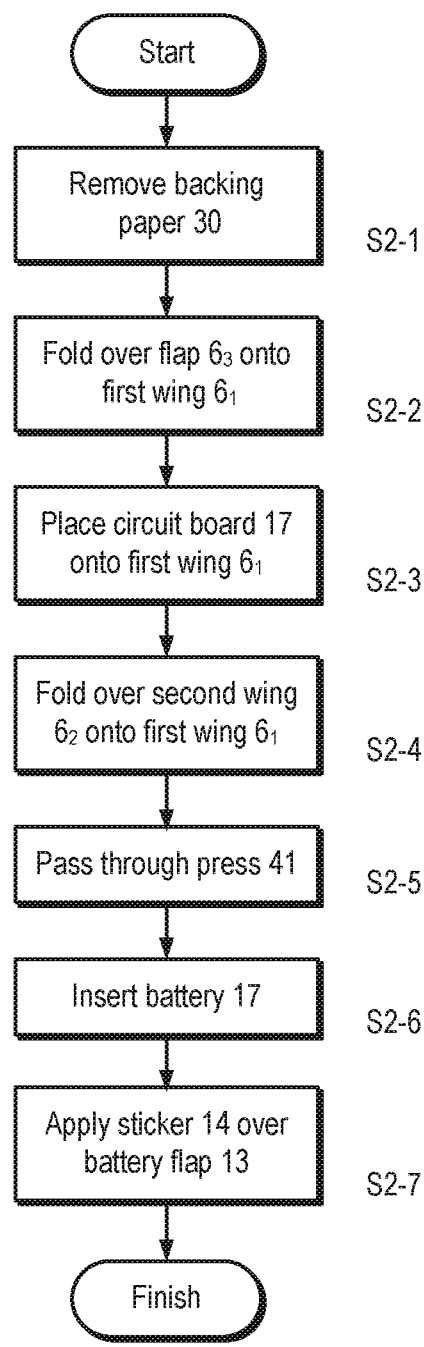
FIG. 10 is a flow diagram of a second process of a printed article.

Referring to FIG. 10, another ways of assembling the device 1 is shown.

The process is similar to that described earlier with reference to FIG. 9. However, the whole device, including circuit board, is passed through the press 41. This may be used particularly when the sheet is at least as thick as the circuit board 17 and any components supported on the board 17, or where an additional spacer insert is used and so the board or components are not subjected to the pressure of the press 41.

Figure 11:
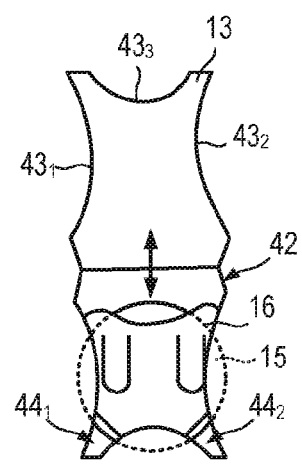
FIG. 11 is a plan view of an open battery flap.
Figure 9:
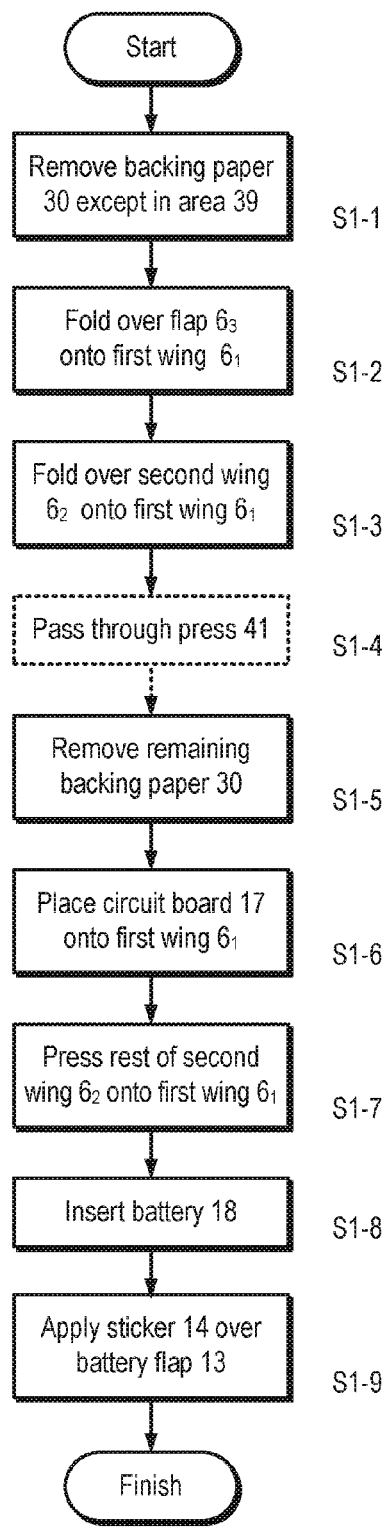
FIG. 9 is a flow diagram of a first process of assembly of a printed article.

FIG. 11 shows the coin cell cover flap 13 is open so as to reveal the coin cell holder 16.

Referring to FIG. 11, the flap 13 and the corresponding aperture 42 formed in the sheet 2 may have inwardly-concave arcuate edges $43_1$, $43_2$, $43_3$. The arcuate edges $43_1$, $43_2$, $43_3$ in the sheet 2 form spaces $44_1$, $44_2$ which allow a tool (not shown) to access the coin cell holder 16 and allow it to push out the cell 15 out. Preferably, the flap is formed by cutting slits in the sheet 2 and so is unitary with the rest of the sheet.

It will be appreciated that many modifications may be made to the embodiments hereinbefore described. Such modifications may involve equivalent and other features which are already known in the design, manufacture and use of capacitive touch devices and component parts thereof and which may be used instead of or in addition to features already described herein. Features of one embodiment may be replaced or supplemented by features of another embodiment.

The article need not be a vinyl record insert. The article may be a pamphlet, flyer, leaflet or other single sheet article. The printed article may be a promotional item. The printed article may be a map or a cover for a map. The printed article may be postcard or greetings card. The printed article may be a map or a cover for a map. The printed article may be an insert for another item, such as a magazine, book or other product. The printed article may be an insert in or part of product packaging. The product may be media (such as a vinyl record or a CD). The product may be an article of clothing, game or food stuff (such as box of cereal). The insert may be free or bound into another item. The printed article may be a game or playing card. The printed article may be a point-of-sale display.

The device may include three, four, five or more wings. The wings need not be all the same size.

The fold lines need not all be parallel. For example, one or more fold lines may be perpendicular to another fold line. Thus, a device may be assembled from a 'L'-shaped, 'T'-shaped, '+'-shaped or other, more complex layouts.

The printed article may include other forms of output device, such as piezoelectric buzzer or other sound-emitting device, and/or one or more light-emitting diodes or other light-emitting or display device(s).

Although claims have been formulated in this application to particular combinations of features, it should be understood that the scope of the disclosure of the present invention also includes any novel features or any novel combination of features disclosed herein either explicitly or implicitly or any generalization thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

The invention claimed is:

1. A capacitive touch device comprising:
   a substrate; and
   a plurality of co-planar capacitive touch switches and conductive tracks connected to the capacitive touch switches disposed directly on a face of the substrate, the capacitive touch switches comprising:
      first and second capacitive touch switches which are adjacent, separated by a channel having a channel width $w_c$, and which are electrically isolated from each other; and
      third and fourth capacitive touch switches which are electrically isolated from the first and second capacitive touch switches, but which are electrically connected to each other by a conductive track having a track width $w_t$ which runs through the channel,
      wherein the channel width $w_c$ is at least three times the track width $w_t$ within the channel; and
      wherein the track width $w_t$ within the channel is between 0.1 mm to 0.5 mm.

2. A capacitive touch device according to claim 1, wherein the conductive track is a first conductive track and the capacitive touch switches further comprise:
   fifth and sixth capacitive touch switches which are electrically isolated from the first, second, third and fourth capacitive touch switches, but which are electrically connected to each other by a second conductive track which runs through the channel.

3. A capacitive touch device according to claim 1, further comprising contact lands, the conductive tracks connecting the touch switches and the contact lands.

4. A capacitive touch device according to claim 1, wherein the capacitive touch switches are arranged to provide a capacitive touch slider.

5. A capacitive touch device according to claim 1, wherein the capacitive touch switches are arranged to provide a capacitive touch wheel.

6. A capacitive touch device according to claim 1, further comprising:

a capacitive touch controller coupled to the capacitive touch switches and configured to have a sensing threshold selected such that, in response to a user's digit passing over the first and second capacitive touch switches but not the third or fourth capacitive touch switches, the controller generates respective triggers for the first and second touch switches, but not triggers for the third or fourth capacitive touch switches.

7. A capacitive touch device according to claim 1, which is a printed article.

8. A capacitive touch device according to claim 1, wherein the conductive track is a first conductive track and the capacitive touch device further comprises:

fifth and sixth capacitive touch switches which are electrically isolated from the first and second capacitive touch switches, but which are electrically connected to each other by a second conductive track which runs through the channel.

9. A capacitive touch device according to claim 1, wherein the capacitive touch switches and conductive tracks comprise conductive ink.

10. A capacitive touch device according to claim 9, wherein the conductive ink is carbon-based.

11. A capacitive touch device according to claim 1, wherein the substrate comprises a fiber-based material.

12. A capacitive touch device according to claim 11, wherein the fiber-based material comprises paper, card, or cardboard.

* * * * *